(12) United States Patent
Lee et al.

(10) Patent No.: US 11,342,394 B2
(45) Date of Patent: May 24, 2022

(54) ORGANIC LIGHT EMITTING DISPLAY PANEL AND ORGANIC LIGHT EMITTING DISPLAY DEVICE INCLUDING THE SAME

(71) Applicant: LG Display Co., Ltd., Seoul (KR)

(72) Inventors: Sunmi Lee, Paju-si (KR); JungSun Beak, Paju-si (KR); Seongjoo Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 13 days.

(21) Appl. No.: 16/932,417

(22) Filed: Jul. 17, 2020

(65) Prior Publication Data

US 2020/0350380 A1 Nov. 5, 2020

Related U.S. Application Data

(63) Continuation of application No. 16/706,534, filed on Dec. 6, 2019, now Pat. No. 10,763,317.

(30) Foreign Application Priority Data

Dec. 17, 2018 (KR) .......................... 10-2018-0163398

(51) Int. Cl.
*H01L 27/32* (2006.01)
*H01L 51/52* (2006.01)
(52) U.S. Cl.
CPC ...... *H01L 27/3246* (2013.01); *H01L 27/3248* (2013.01); *H01L 51/5209* (2013.01); *H01L 51/5218* (2013.01)
(58) Field of Classification Search
CPC ......... H01L 27/3244; H01L 2251/5338; H01L 51/0097; H01L 27/124; H01L 27/322;
(Continued)

(56) References Cited

U.S. PATENT DOCUMENTS

2005/0116632 A1* 6/2005 Funamoto ........... H01L 51/0005
313/506
2014/0070182 A1 3/2014 Choi et al.
(Continued)

FOREIGN PATENT DOCUMENTS

| EP | 3355357 A1 | 8/2018 |
| KR | 10-2005-0022991 A | 3/2005 |
| KR | 10-2017-0051764 A | 5/2017 |

OTHER PUBLICATIONS

Extended European Search Report, European Patent Application No. 19216939.9, dated May 26, 2020, 9 pages.

*Primary Examiner* — Robert G Bachner
(74) *Attorney, Agent, or Firm* — Fenwick & West LLP

(57) ABSTRACT

A display panel and an organic light emitting display device with enhanced light extraction efficiency is described. The display panel and the display device include an insulating film including at least one concave portion, a first electrode disposed to cover the concave portion, a bank including a first part on the first electrode and overlapping a part of the flat portion of the concave portion, a second part extending from the first part and overlapping an inclined portion of the concave portion, and a third part extending from the second part and disposed on the side portion, an organic layer overlapping the concave portion, and a second electrode on the organic layer and the bank. A width of the first part of the bank is wider than a width of the second part of the bank. Thus, it is possible to provide a display device with enhanced light extraction efficiency.

19 Claims, 13 Drawing Sheets

(58) Field of Classification Search
CPC ............ H01L 27/3276; H01L 29/7869; H01L 227/323; H01L 27/1225; H01L 27/3262; H01L 27/3211; H01L 27/3218; H01L 27/3246; H01L 51/56; H01L 27/1222; H01L 27/3258; H01L 29/78696; H01L 51/5253; G02F 21/1368; G02F 21/136286; G02F 21/133345; G02F 1/134309; G02F 1/133514; G02F 1/136227; G02F 2201/123; G02F 1/133553; G02F 1/136213; G02F 2201/121; G02F 1/133512; G02F 1/1339; G02F 1/134363; G02F 1/13624; G02F 2001/134372; G02F 2201/44; G02F 2202/10; G02F 1/1333; G02F 1/133305; G02F 1/13338; G02F 1/133528; G02F 1/133555; G02F 1/133707; G02F 1/13394; G02F 1/1343; G02F 2001/133638; G02F 2001/134345; G02F 1/133; G02F 1/13306; G02F 1/13318; G02F 1/13308; G02F 1/1334; G02F 1/133504; G02F 1/133621; G02F 1/13363; G02F 1/1337; G02F 1/133711; G02F 1/133753; G02F 1/134336; G02F 1/13439; G02F 1/13452; G02F 1/13454; G02F 1/1362; G02F 1/136209; G02F 1/136259; G02F 1/137; G02F 1/167; G02F 2001/133519; G02F 2001/133541; G02F 2001/133626; G02F 2001/133742; G02F 2001/13398; G02F 2001/134318; G02F 2001/13606; G02F 2001/136222; G02F 2001/136231; G02F 2001/136272; G02F 2001/13629; G02F 2001/13685; G02F 2001/13706; G02F 2001/13756; G02F 2001/124; G02F 2201/40; G02F 2201/52; G02F 2202/103; G02F 2202/104; G02F 2203/09; G09G 2203/09; G09G 3/3233; G09G 2300/0426; G09G 3/3266; G09G 2300/0452; G09G 2300/0842; G09G 2310/08; G09G 2380/02; G09G 3/20; G09G 3/3648; G09G 3/3677; G09G 2300/0814; G09G 2300/0819; G09G 2300/0852; G09G 2320/042; G09G 2330/021; G09G 3/2003; G09G 2300/0439; G09G 2300/0456; G09G 2310/0251; G09G 2320/043; G09G 2320/0626; G09G 3/2074; G09G 3/3225; G09G 3/3258; G09G 3/3291; G09G 3/36; G09G 3/3688; G09G 2230/00; G09G 2300/023; G09G 2300/0443; G09G 2300/046; G09G 2300/0465; G09G 2300/0809; G09G 2300/0857; G09G 2300/0861; G09G 2310/0262; G09G 2310/0286; G09G 2320/02; G09G 2320/0233; G09G 2320/066; G09G 2340/0435; G09G 2354/00; G09G 3/342; G09G 3/3607; G09G 2300/0408; G09G 2300/0486; G09G 2300/08; G09G 2300/0866; G09G 2300/0876; G09G 2300/0885; G09G 2310/02; G09G 2310/0235; G09G 2310/024; G09G 2310/0256; G09G 2310/027; G09G 2310/0281; G09G 2310/0289; G09G 2310/0297; G09G 2310/06; G09G 2310/063; G09G 2320/0209; G09G 2320/0214; G09G 2320/0219; G09G 2320/0223; G09G 2320/0238; G09G 2320/0247; G09G 2320/0252; G09G 2320/0257; G09G 2320/0261; G09G 2320/0276; G09G 2320/028; G09G 2320/0295; G09G 2320/068; G09G 2320/10; G09G 2320/103; G09G 2320/106; G09G 2330/04; G09G 2330/12; G09G 2340/02; G09G 2340/0442; G09G 2340/16; G09G 2360/144; G09G 2360/145; G09G 2370/08; G09G 2380/10; G09G 3/001; G09G 3/2007; G09G 3/2022; G09G 3/2092; G09G 3/30; G09G 3/32; G09G 3/3208; G09G 3/3275; G09G 3/3614; G09G 3/3655; G09G 3/3659

See application file for complete search history.

(56) References Cited

U.S. PATENT DOCUMENTS

| | | | |
|---|---|---|---|
| 2014/0127846 A1* | 5/2014 | Yamada | ............... H01L 51/5088 438/46 |
| 2015/0060820 A1* | 3/2015 | Takagi | ................ H01L 27/3246 257/40 |
| 2017/0125740 A1 | 5/2017 | Lee et al. | |

* cited by examiner

ORGANIC LIGHT EMITTING DISPLAY PANEL AND ORGANIC LIGHT EMITTING DISPLAY DEVICE INCLUDING THE SAME

CROSS-REFERENCE TO RELATED APPLICATION

This application is a continuation of U.S. patent application Ser. No. 16/706,534 filed on Dec. 6, 2019 which claims the priority benefit of Republic of Korea Patent Application No. 10-2018-0163398, filed on Dec. 17, 2018 in the Korean Intellectual Property Office, each of which is incorporated herein by reference in its entirety.

FIELD OF THE DISCLOSURE

The present disclosure relates to an organic light emitting display panel and an organic light emitting display device including the same.

BACKGROUND

As the advent of the information society, there have been growing needs for various display panels for using in display devices, lighting devices, or the like. Among various types of display panel, an organic light emitting display panel is advantageous in a reduction in overall weight and thickness as an additional light source is not required. As a result, demands for the organic light emitting display panel have increased steadily.

However, when the organic light emitting display panel including an organic layer emitting light is operated, there is a problem that light extraction efficiency of the organic light emitting display panel is lowered and corresponding luminance efficiency is lowered because some of the light emitted from an organic layer cannot be emitted outside of the organic light emitting display panel, and therefore is trapped inside the organic light emitting display device.

SUMMARY

To address such issues, an object of the present disclosure is to provide organic light emitting display panels and organic light emitting display devices with enhanced light extraction efficiency.

It is another object of the present disclosure to provide organic light emitting display panels and organic light emitting display devices having a structure for preventing color mixing between adjacent subpixels.

It is further another object of the present disclosure to provide organic light emitting display panels and organic light emitting display devices having a structure for reducing a distance that light emitted from an organic layer is extracted to outside of the display.

It is still another object of the present disclosure to provide organic light emitting display panels and organic light emitting display devices having a structure in which color coordinates of one or more light emitting areas which emit an identical color correspond to one another.

In accordance with an aspect of the present disclosure, an organic light emitting display panel comprises: a substrate including an active area that displays an image and a non-active area that does not display the image; an insulating film disposed on the substrate, the insulating film including at least one concave portion in the active area, the concave portion having a flat portion, an inclined portion that extends from the flat portion and surrounds the flat portion, and a side portion that extends from the inclined portion and is farther from the substrate than the flat portion; a first electrode disposed on the side portion, the inclined portion, and the flat portion of the concave portion of the insulating film; a bank including a first part, a second part, and a third part, wherein the first part is disposed on the first electrode and overlaps a portion of the flat portion of the concave portion, the second part extends from the first part and overlaps the inclined portion of the concave portion, and the third part extends from the second part and overlaps the side portion, wherein a width of the first part of the bank is wider than a width of the second part of the bank; an organic light emitting layer on the first electrode and the bank, the organic light emitting layer overlapping the concave portion of the insulating film; and a second electrode disposed on the organic layer and the bank, the second electrode overlapping the concave portion of the insulating film.

In one embodiment, an organic light emitting display device comprises: an active area including a plurality of subpixels that display an image and a non-active area surrounding the active area, the non-active area does not display the image, wherein at least one subpixel of the plurality of subpixels comprises: an insulating film disposed over a substrate, the insulating film including a concave portion having a flat portion, an inclined portion that extends from the flat portion and surrounds the flat portion, and a side portion that extends from the inclined portion and is farther from the substrate than the flat portion; a first electrode including a first area, a second area, and a third area, wherein the first area overlaps the flat portion of the concave portion, the second area extends from the first area and overlaps the inclined portion of the concave portion, and the third area extends from the second area and overlaps the side portion; a bank including a first part, a second part, and a third part, wherein the first part is disposed on the first electrode and overlaps a portion of the flat portion of the concave portion, the second part extends from the first part and overlaps the inclined portion of the concave portion, and the third part extends from the second part the side portion; an organic light emitting layer on the first electrode and the bank, the organic light emitting layer overlapping the concave portion of the insulating film; and a second electrode disposed on the organic layer and the bank, the second electrode overlapping the concave portion of the insulating film; wherein an area in which the bank and the first area of the first electrode are non-overlapping is a first light emitting area, and an area in which the bank and the first area of the first electrode overlap each other in the flat portion of the concave portion is a first non-light emitting area, wherein an area in which the bank and the second area of the first electrode overlap is a second light emitting area, and an area in which the bank overlaps the third area of the first electrode is a second non-light emitting area.

In one embodiment, an organic light emitting display panel comprising: a substrate including an active area that displays an image and a non-active area that does not display the image; a transistor in the active area of the substrate; an insulating film disposed over the transistor in the active area of the substrate, the insulating film including a concavity; and a sub-pixel electrically connected to the transistor, the sub-pixel including a plurality of concentric light emitting areas and a non-light emitting area in the concavity of the insulating film, the non-light emitting area disposed between the plurality of concentric light emitting areas.

In accordance with embodiments of the present disclosure, it is possible to provide organic light emitting display panels and organic light emitting display devices having a structure in which luminous efficiency is enhanced.

In accordance with embodiments of the present disclosure, it is possible to provide organic light emitting display panels and organic light emitting display devices capable of preventing color mixing between adjacent subpixels.

In accordance with embodiments of the present disclosure, it is possible to provide organic light emitting display panels and organic light emitting display devices having a structure for reducing a distance that light emitted from an organic layer is extracted to outside of the display.

In accordance with embodiments of the present disclosure, it is possible to provide organic light emitting display panels and organic light emitting display devices having a structure in which color coordinates of one or more light emitting areas which emit an identical color correspond to one another.

DETAILED DESCRIPTION

Figure 1:
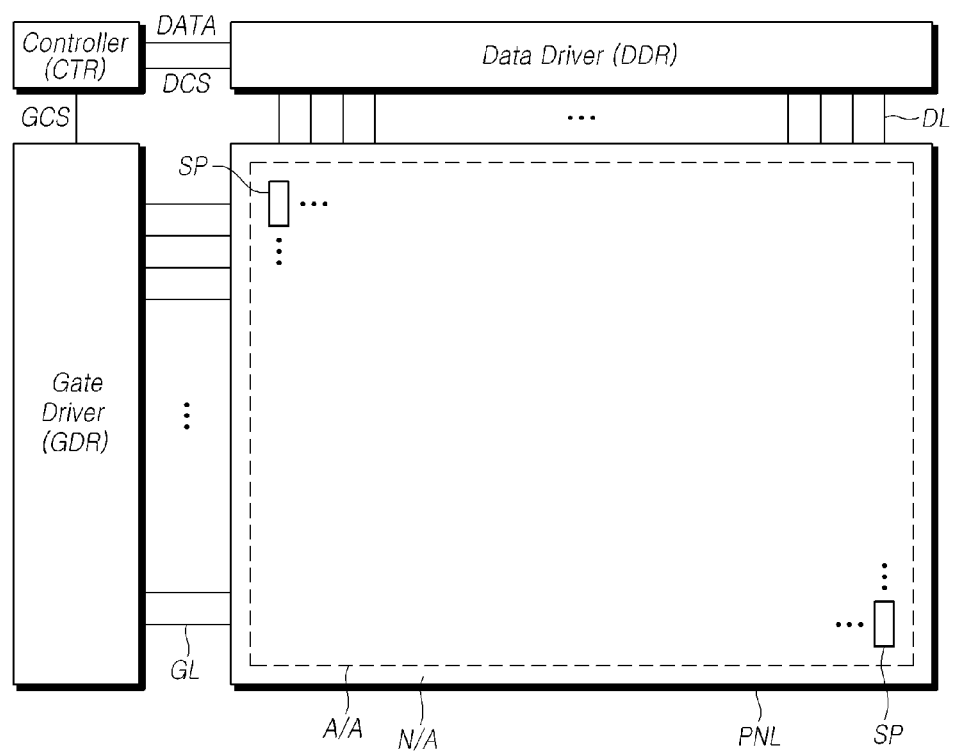
FIG. 1 is a block diagram schematically illustrating an organic light emitting display device according to embodiments of the present disclosure.

The advantages and features of the present disclosure and methods of achieving the same will be apparent by referring to aspects of the present disclosure as described below in detail in conjunction with the accompanying drawings. However, the present disclosure is not limited to the aspects set forth below, but may be implemented in various different forms. The following aspects are provided only to completely disclose the present disclosure and inform those skilled in the art of the scope of the present disclosure, and the present disclosure is defined only by the scope of the appended claims.

In addition, the shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description of the present disclosure, detailed description of well-known functions and configurations incorporated herein will be omitted when it is determined that the description may make the subject matter in some embodiments of the present disclosure rather unclear. The terms such as "including", "having", "containing", and "comprising" used herein are generally intended to allow other components to be added unless the terms are used with the term "only". As used herein, singular forms are intended to include plural forms unless the context clearly indicates otherwise.

In interpreting any elements or features of the embodiments of the present disclosure, it should be considered that any dimensions and relative sizes of layers, areas and regions include a tolerance or error range even when a specific description is not conducted.

Terms, such as first, second, A, B, (a), or (b) may be used herein to describe elements of the disclosure. Each of the terms is not used to define essence, order, sequence, or number of an element, but is used merely to distinguish the corresponding element from another element. When it is mentioned that an element is "connected" or "coupled" to another element, it should be interpreted that another element may be "interposed" between the elements or the elements may be "connected" or "coupled" to each other via another element as well as that one element is directly connected or coupled to another element. Spatially relative terms, such as, "on", "over", "above", "below", "under", "beneath", "lower", "upper", "near", "close", "adjacent", and the like, may be used herein to describe one element or feature's relationship to another element(s) or feature(s) as illustrated in the figures, and it should be interpreted that one or more elements may be further "interposed" between the elements unless the terms such as "directly", "only" are used.

Any elements or features of the embodiments of the present disclosure are not limited to a specific meaning of the terms described above. The terms as used herein are merely for the purpose of describing examples and are not intended to limit the present disclosure. Although the terms "first", "second", and the like are used for describing various elements, or features, these elements are not confined by these terms. These terms are merely used for distinguishing one element from other elements. Therefore, a first element to be mentioned below may be a second element in a technical concept of the present disclosure.

The elements or features of various exemplary embodiments of the present disclosure can be partially or entirely bonded to or combined with each other and can be interlocked and operated in technically various ways as can be fully understood by a person having ordinary skill in the art, and the various exemplary embodiments can be carried out independently of or in association with each other.

Hereinafter, exemplary embodiments of the present disclosure will be described in detail with reference to the accompanying drawings.

FIG. 1 is a block diagram schematically illustrating a configuration of an organic light emitting display device according to embodiments of the present disclosure.

In accordance with embodiments of the present disclosure, the display device may include a panel (PNL) for displaying images or emitting light, and a driving circuit (or a driver) for driving the panel (PNL).

The panel (PNL) may include a plurality of data lines (DL) and a plurality of gate lines (GL), and include a plurality of subpixels (SP) that is defined by the plurality of data lines (DL) and the plurality of gate lines (GL) and that is arranged in a matrix pattern.

The plurality of data lines (DL) and the plurality of gate lines (GL) may be arranged to intersect each other in the panel (PNL). For example, the plurality of gate lines (GL) may be arranged in a first direction or on one of a row or a column, and the plurality of data lines (DL) may be arranged in a second direction or on the other of the row or the column Hereinafter, for convenience of description and ease of understanding, it may be considered that the plurality of gate lines (GL) is arranged on one or more rows and the plurality of data lines (DL) is arranged on one or more columns.

The panel (PNL) may include other types of signal line other than the plurality of data lines (DL) and the plurality of gate lines (GL), according to a structure of a subpixel, etc. For example, the display panel may further include at least one driving voltage line, at least one reference voltage line, at least one common voltage line, or the like.

For example, one or more different types of signal line may be disposed in the panel (PNL) depending on a structure of subpixels, a type of panel (e.g., an LCD panel, an OLED panel, etc.), or the like. In the present disclosure, the signal line may denote a term including an electrode to which a signal is applied.

The panel PNL may include an active area (A/A) in which an image is displayed, and a non-active area (N/A) in which an image is not displayed, which is located in an outer area of the active area (A/A). Here, the non-active area (N/A) may be referred to as a bezel area or an edge area of the panel or the display device.

A plurality of subpixels (SP) is arranged in the active area (A/A) for displaying images.

A pad area including at least one pad, such as a conductive trace, and electrically connected to a data driver (DDR) is disposed in the non-active area (N/A). A plurality of data link lines may be disposed in the non-active area (N/A) for electrically connecting the pad area to the plurality of data lines (DL). In this case, the plurality of data link lines may be a part of the plurality of data lines (DL) extending to the non-active area (N/A), or be separate patterns electrically connected to the plurality of data lines (DL).

In addition, the non-active area (N/A) further may include gate-driving-related lines for delivering a voltage (signal) needed for driving at least one gate of at least one transistor for driving at least one subpixel from the pad electrically connected to the data driver (DDR) to a gate driver (GDR). For example, the gate-driving-related lines may include clock lines for delivering clock signals, gate voltage lines for delivering gate voltages (VGH, VGL), gate driving control signal lines for delivering various control signals needed for generating scan signals, or the like. The gate-driving-related lines are arranged in the non-active area (N/A), unlike gate lines (GL) arranged in the active area (A/A).

The driving circuit may include the data driver (DDR) for driving the plurality of data lines (DL), the gate driver (GDR) for driving the plurality of gate lines (GL), and a controller (CTR) for controlling the data driver (DDR) and the gate driver (GDR).

The data driver (DDR) may drive the plurality of data lines (DL) by outputting data voltages to the plurality of data lines (DL).

The gate driver (GDR) may drive the plurality of gate lines (GL) by outputting scan signals to the plurality of gate lines (GL).

The controller (CTR) may provide various control signals (DCS, GCS) needed for driving and/or operating the data driver (DDR) and the gate driver (GDR), and control the driving and/or operating of the data driver DDR and the gate driver (GDR). In addition, the controller (CTR) may provide image data (DATA) to the data driver (DDR).

The controller (CTR) starts scanning operation according to timing processed in each frame, converts image data (DATA) input from other devices or image providing sources to a data signal form used in the data driver (DDR) and then outputs resulted image data from the converting, and controls the driving of at least one data line at a pre-configured time aligned with the scanning operation.

In order to control the data driver (DDR) and the gate driver (GDR), the controller (CTR) receives a timing signal, such as, a vertical synchronous signal (Vsync), a horizontal synchronous signal (Hsync), an input data enable (DE) signal, a clock signal (CLK), or the like, from other devices or image providing sources, such as, a host system, and generates various control signals and outputs the generated signals to the data driver (DDR) and the gate driver (GDR).

For example, to control the gate driver (GDR), the controller (CTR) outputs various gate control signals (GCS) including a gate start pulse (GSP), a gate shift clock (GSC), a gate output enable signal (GOE), or the like.

In addition, to control data driver (DDR), the controller (CTR) outputs various data control signals (DCS) including a source start pulse (SSP), a source sampling clock (SSC), a source output enable signal (SOE), or the like.

The controller (CTR) may be a timing controller used in the typical display technology or a control apparatus/device capable of additionally performing other control functionalities in addition to the typical function of the timing controller.

The controller (CTR) may be implemented as a separate unit from the data driver (DDR), or integrated with the data driver (DDR) and implemented as an integrated circuit.

The data driver (DDR) receives image data (DATA) from the controller (CTR), and provides data voltages to the plurality of data lines (DL). Thus, the data driver (DDR) drives the plurality of data lines (DL). Herein, the data driver (DDR) may also be referred to as a "source driver."

The data driver (DDR) may transmit various signals to and/or receive them from the controller (CTR) through various interfaces.

The gate driver (GDR) sequentially drives the plurality of gate lines (GL) by sequentially providing scan signals to the plurality of gate lines (GL). Herein, the gate driver (GDR) may also be referred to as a "scan driver."

According to controlling of the controller (CTR), the gate driver (GDR) sequentially provide a scan signal, such as an on-voltage or an off-voltage to the plurality of gate lines (GL).

When a specific gate line is asserted by a scan signal from the gate driver (GDR), the data driver (DDR) converts image data (DATA) received from the controller (CTR) into analog data voltages and provides the resulted analog data voltages to the plurality of data lines (DL).

The data driver (DDR) may be located on, but not limited to, only one side (e.g., an upper side or a lower side) of the panel (PNL), or in some embodiments, be located on, but not limited to, two sides (e.g., an upper side and a lower side) of the panel (PNL) according to driving schemes, panel design schemes, or the like.

The gate driver (GDR) may be located on, but not limited to, only one side (e.g., a left side or a right side) of the panel (PNL), or in some embodiments, be located on, but not limited to, two sides (e.g., a left side and a right side) of the panel (PNL) according to driving schemes, panel design schemes, or the like.

The data driver (DDR) may be implemented by including one or more source driver integrated circuits (SDIC).

Each source driver integrated circuit (SDIC) may include a shift register, a latch circuit, a digital to analog converter DAC, an output buffer, or the like. In some embodiments, the data driver (DDR) may further include one or more analog to digital converters (ADC).

Each source driver integrated circuit SDIC may be connected to the pad, such as a bonding pad, of the panel (PNL) in a tape automated bonding (TAB) type or a chip on glass (COG) type, or be directly disposed on the panel (PNL). In some instances, each source driver integrated (SDIC) may be integrated and disposed on the panel (PNL). In addition, each source driver integrated circuit (SDIC) may be implemented in a chip on film (COF) type. In this case, each source driver integrated circuit (SDIC) may be mounted on a circuit film and electrically connected to the data lines (DL) arranged in the panel (PNL) through the circuit film.

The gate driver (GDR) may include a plurality of gate driving circuits (GDC). The plurality of gate driving circuits (GDC) may correspond to the plurality of gate lines (GL), respectively.

Each gate driving circuit (GDC) may include a shift register, a level shifter, and the like.

Each gate driving circuit (GDC) may be connected to the pad, such as a bonding pad, of the panel (PNL) in a tape automated bonding (TAB) type or a chip on glass (COG) type. In addition, each gate driving circuit (GDC) may be implemented in a chip on film (COF) type. In this case, each gate driving circuit (GDC) may be mounted on a circuit film and electrically connected to the gate lines (GL) arranged in the panel (PNL) through the circuit film. In addition, each gate driving circuit (GDC) may be integrated into the panel (PNL) in a gate in panel (GIP) type. That is, each gate driving circuit (GDC) may be directly formed in the panel (PNL).

Figure 2:
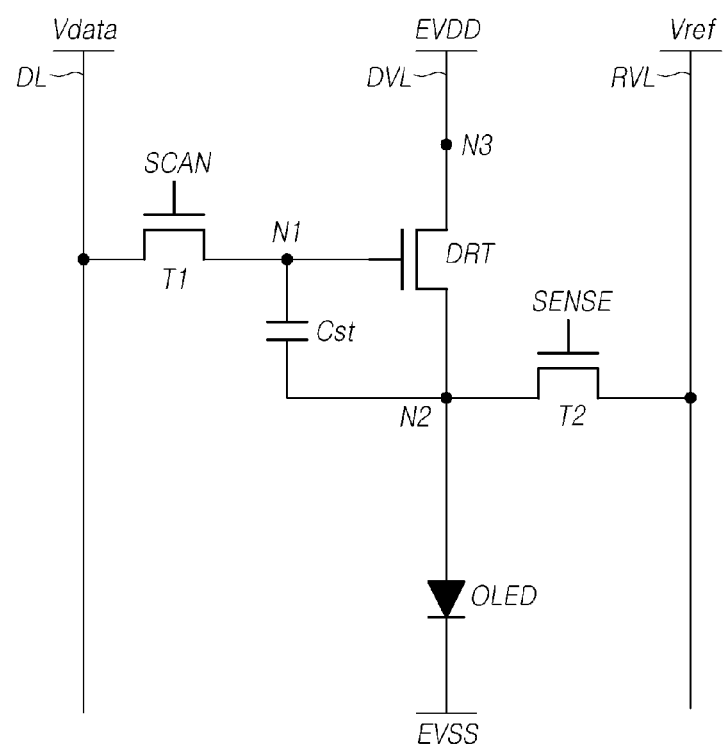
FIG. 2 is a view illustrating a 3T (Transistor) 1C (Capacitor) structure in which one subpixel further includes a second transistor electrically connected between a second node of a driving transistor and a reference voltage line.

FIG. 2 is a view illustrating a 3T (Transistor) 1C (Capacitor) structure in which one subpixel further includes a second transistor electrically connected between a second node of a driving transistor and a reference voltage line.

Referring to FIG. 2, the second transistor (T2) may be electrically connected between the second node (N2) of the driving transistor (DRT) and the reference voltage line (RVL), and on-off operations of the second transistor (T2) may be controlled by receiving a sense signal (SENSE) through its gate node.

A drain node or a source node of the second transistor (T2) is electrically connected to the reference voltage line (RVL), and the source node or the drain node of the second transistor (T2) is electrically connected to the second node (N2) of the driving transistor (DRT).

The second transistor (T2) may be turned on during a display driving section, or turned on during a sensing driving section for sensing characteristic values of the driving transistor (DRT) or characteristic values of an organic light emitting diode (OLED).

The second transistor (T2) may be turned on by the sense signal (SENSE) according to a corresponding driving timing (e.g., a display driving timing or a reset timing in the sensing driving section), and transfer a reference voltage (Vref) supplied to the reference voltage line (RVL) to the second node (N2) of the driving transistor (DRT).

In addition, the second transistor (T2) may be turned on by the sense signal (SENSE) according to a corresponding driving timing (e.g., a sampling timing in the sensing driving section), and transfer a voltage of the second node (N2) of the driving transistor (DRT) to the reference voltage line (RVL).

In other words, the second transistor (T2) may control a voltage state of the second node (N2) of the driving transistor (DRT), or transfer the voltage of the second node (N2) of the driving transistor (DRT) to the reference voltage line (RVL).

The reference voltage line (RVL) may be electrically connected to the analog to digital converter that senses a voltage of the reference voltage line (RVL), converts the sensed voltage to a digital value, and outputs sensing data including the digital value.

The analog to digital converter may be included in a source driving integrated circuit (SDIC) implementing the data driver (DDR).

The sensing data from the analog to digital converter may be used for sensing characteristic values (e.g., a threshold voltage, mobility, etc.) of the driving transistor (DRT) or characteristic values (e.g., a threshold voltage, etc.) of the organic light emitting diode (OLED).

Meanwhile, a storage capacitor (Cst) may be an external capacitor configured to be located on outside of the driving transistor (DRT) other than an internal capacitor, that is, a parasitic capacitor (e.g., a Cgs, a Cgd), that presents between a first node (N1) and the second node (N2) of the driving transistor (DRT).

Each of the driving transistor (DRT), a first transistor (T1) and the second transistor (T2) may be an n-type transistor or a p-type transistor.

A first scan signal (SCAN) and the second scan signal (SENSE) may be different gate signals. In this case, the first scan signal (SCAN) and the second scan signal (SENSE) respectively may be supplied to a gate node of the first transistor (T1) and a gate node of the second transistor (T2) through different gate lines.

The first scan signal (SCAN1) and the second scan signal (SENSE) may be an identical gate signal. In this case, the identical gate signal may be commonly supplied to the gate node of the first transistor (T1) and the gate node of the second transistor (T2) through an identical gate line.

It is noted that the subpixel structure as shown in FIG. 2 is merely one example of possible structures, and one or more transistors may be removed, or one or more transistors may be further included. In some embodiments, one or more capacitors may be further included.

In some embodiments, a plurality of subpixels may have an identical structure, or one or more of the plurality of subpixels may have different structure from the others.

Luminance of the panel (PNL) may be different depending on an amount of light that is extracted to outside of the panel (hereinafter, referred to as the term "amount of extracted light" convenience of description) after having been emitted from the organic light emitting device disposed in the active area (A/A). In other words, the luminance of the panel (PNL) may enhance as an amount of light extracted to outside of the panel from the organic light emitting device increases. Hereinafter, a structure of a substrate configured with an array of thin film transistors will be described for enhancing an amount of extracted light.

In accordance with embodiments of the present disclosure, a display panel, such an organic light emitting display panel etc. includes a substrate including an active area and a non-active area, an insulating film disposed over the substrate and including at least one concave portion having a flat portion and an inclined portion surrounding the flat portion in at least one subpixel of the active area, a first electrode disposed on an side portion of the concave portion and on the concave portion in an areas of at least one subpixel area, a bank including a first part disposed on the first electrode and the insulating film, and overlapping a part of the flat portion of the concave portion, a second part extending from the first part, and overlapping an inclined portion of the concave portion, and a third part extending from the second part, and disposed on the side portion, an organic layer overlapping the concave portion, and disposed on the first part of the bank and the first electrode, a second electrode disposed on the organic layer and the bank. A width of the first part of the bank may be larger than that of the second part thereof.

At least one concave portion may be included in an insulating film of at least one of the plurality of subpixels disposed in the active area.

The organic light emitting display panel as described above will be discussed in detail with reference to the accompanying drawings.

Figure 3:
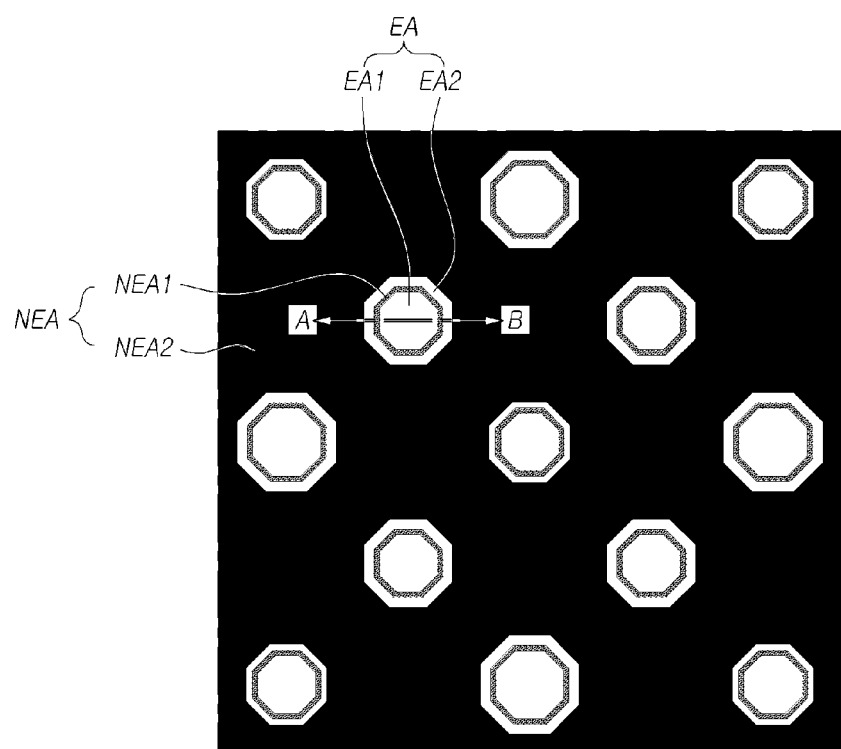
FIG. 3 is a plan view illustrating a light emitting area and a non-light emitting area included in an active area of the organic light emitting display panel according to embodiments of the present disclosure.
Figure 4:
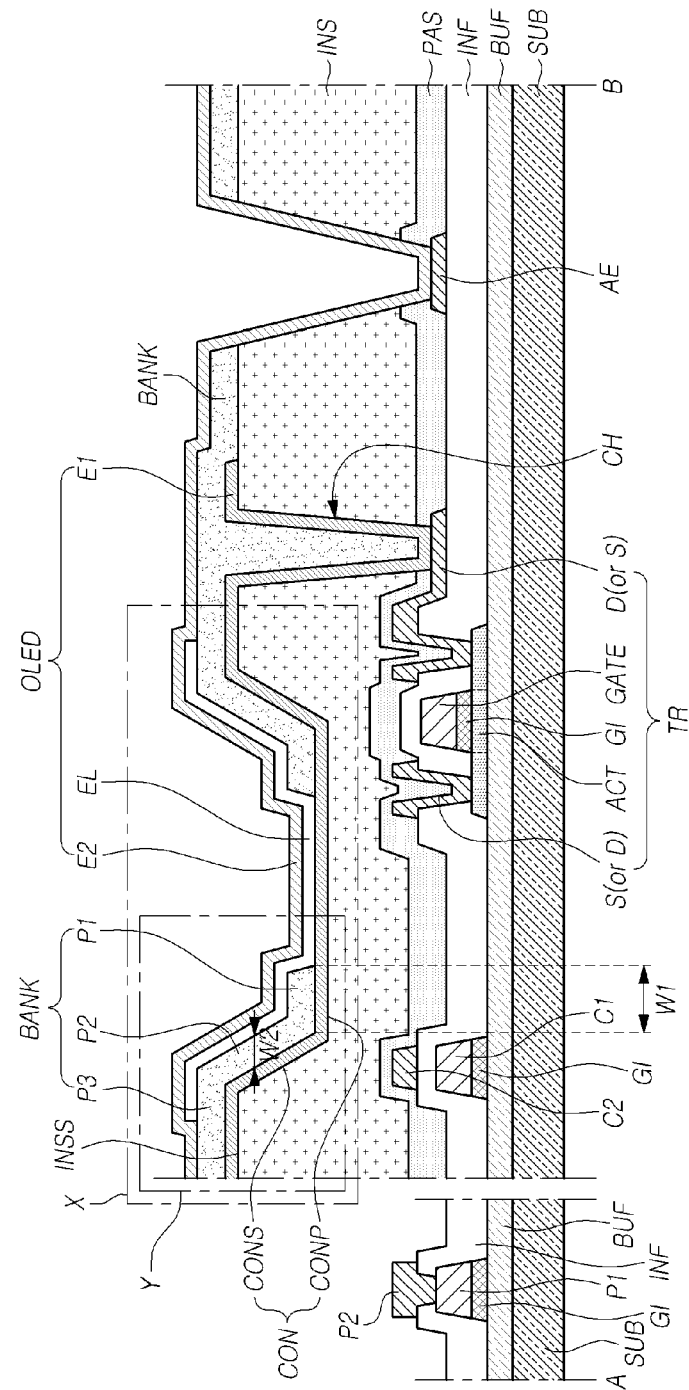
FIG. 4 is a cross-sectional view illustrating a part of a pad area taken along with line A-B of FIG. 3 according to embodiments of the present disclosure.

FIG. 3 is a plan view illustrating a light emitting area and a non-light emitting area included in an active area of the organic light emitting display panel according to embodiments of the present disclosure. FIG. 4 is a cross-sectional view illustrating a part of a pad area taken alone with line A-B of FIG. 3 according to embodiments of the present disclosure. FIG. 4 shows some of configurations and areas disposed in one subpixel, and shows some configurations and areas disposed in the pad area.

Referring to FIG. 3, a plurality of light emitting areas (EA) and a plurality of non-light emitting areas (NEA) are disposed in the active area (A/A).

As shown in FIG. 3, sizes of the light emitting areas (EA) of two or more subpixels (SP) may be different in some implementations, but embodiments of the present disclosure are not limited thereto.

Each subpixel (SP) disposed in the active area (A/A) may include a plurality of light emitting areas (EA1, EA2).

Specifically, one subpixel (SP) may include a first light emitting area (EA1) and a second light emitting area (EA2) surrounding the first light emitting area (EA1).

A first non-light emitting area (NEA1) may be disposed between the first light emitting area (E1) and the second light emitting area (EA2) surrounding the first light emitting area (EA1). As shown in FIG. 3, the first light emitting area (EA1) and the second light emitting area (EA2) are concentric with the first non-light emitting area (NEA1) disposed between the first light emitting area (EA1) and the second light emitting area (EA2).

The first light emitting area (EA1) and the second light emitting area (EA2) may be separated from each other by the first non-light emitting area (NEA1). Meanwhile, the first non-light emitting area (NEA1) disposed between the first light emitting area (EA1) and the second light emitting area (EA2) may be an area in which both visible light of the first light emitting area (EA1) and visible light of the second light emitting area (EA2) are present, but embodiments of the present disclosure are not limited thereto.

In addition, a second non-light emitting area (NEA2) may disposed to surround the second light emitting area (EA2).

As shown in FIG. 3. the first light emitting area (EA1), second light emitting area (EA2), and the first non-light emitting area (NEA1) may be octagonal in a plan view. However, embodiments of the present disclosure are not limited thereto. The first light emitting area (EA1), the second light emitting area (EA2), and the first non-light emitting area (NEA1) may be circular, elliptical, or polygonal, such as triangular, square, hexagonal, etc. or combinations thereof, in a plan view.

A pair of first and second light emitting areas (EA1, EA2) may be spaced from another pair of first and second light emitting areas (EA1, EA2). The second non-light emitting area (NEA2) may be disposed between one pair of first and second light emitting areas (EA1, EA2) and another pair of first and second light emitting areas (EA1, EA2).

The second non-light emitting area (NEA2) may be an area corresponding to all or part of a circuit unit including a circuit for driving the first and second light emitting areas (EA1, EA2).

Referring to FIG. 4, a transistor (TR) disposed over the substrate (SUB) and an organic light emitting device (OLED) electrically connected to the transistor (TR) are disposed in the active area (an area taken along with A/A, A-B). In addition, at least one pad area is located in the non-active area (N/A).

The transistor (TR) may include the activation layer (ACT), a gate electrode (GATE), a source electrode (S) and a drain electrode (D).

The organic light emitting device (OLED) includes a first electrode (E1), an organic layer (EL) including a light emitting layer, and a second electrode (E2). Here, the first electrode (E1) may be an anode electrode, and the second electrode (E2) may be a cathode electrode. However, the embodiments of the present disclosure are not limited thereto.

Specifically, a buffer layer (BUF) is disposed on the substrate (SUB). The active layer (ACT) of the transistor is disposed on the buffer layer (BUF). A gate insulating film (GI) is disposed on the activation layer (ACT), and the gate electrode GATE is disposed on the gate insulating film (GI).

Meanwhile, although not shown in FIG. 4, the active layer (ACT) according to embodiments of the present disclosure includes a channel area. The channel area of the active layer (ACT) may overlay with the gate insulating film (GI) and the gate electrode (GATE). In other words, the gate insulating film (GI) and the gate electrode (GATE) may be disposed on the channel area of the active layer (ACT).

An interlayer insulating film (INF) is disposed on the gate electrode (GATE). The source electrode (S) and the drain electrode (D) are disposed on the interlayer insulating film (INF). The source electrode (S) and the drain electrode (D) may be disposed to be spaced from each other on the interlayer insulating film (INF). Each of the source electrode (S) and the drain electrode (D) may contact the active layer (ACT) through a hole formed through the interlayer insulating film (INF).

The transistor may be disposed over the substrate (SUB) based on the structure described above, but transistor structures of the present disclosure are not limited thereto.

For example, the gate electrode (GATE) may be disposed over the substrate (SUB), the active layer (ACT) may be disposed over the gate electrode, and the source electrode (S) may be disposed to overlap one end of the active layer (ACT) and the drain electrode (D) may be disposed to overlap the other end of the active layer (ACT), over the active layer (ACT).

Further, a passivation layer (PAS) may be disposed to cover the transistor.

The insulating film (INS) may be disposed on the passivation layer (PAS).

The insulating film (INS) may be formed of an organic material, but embodiments of the present disclosure are not limited thereto.

Such an insulating film (INS) may have at least one concave portion (CON) in one subpixel area. The insulating film (INS) may surround the concave portion (CON), and have a side portion (INS S) located around the concave portion (CON). The concave portion (CON) may include a flat portion (CONP) and an inclined portion (CONS) surrounding the flat portion (CONP).

A surface of the flat portion (CONP) of the concave portion (CON) may be a portion parallel to a surface of the substrate (SUB). The inclined portion (CONS) may surround the flat portion (CONP), and a surface of the inclined portion (CONS) may be a portion having a certain angle with respect to the surface of the substrate (SUB).

In addition, the insulating film (INS) may have a hole (CH) spaced from the concave portion (CON).

The first electrode (E1) may be disposed on the side portion (INSS) and the concave portion (CON) in at least one subpixel area.

In addition, as described above, the insulating film (INS) may include at least one hole spaced from the concave portion (CON) in one subpixel area. The transistor (TR) and the first electrode (E1) of the organic light emitting device (OLED) may be electrically connected through the hole (CH) of the insulating film (INS). Specifically, the first electrode (E1) may be electrically connected to the source electrode (S) or the drain electrode (D) of the transistor (TR).

The first electrode (E1) may include a reflective electrode.

The bank (BANK) may be disposed on the first electrode (E1) and the insulating film (INS). The bank (BANK) may include a first part (P1) overlapping a part of the flat portion CONP, a second part (P2) extending from the first part (P1) and overlapping the inclined portion of the concave portion (CON), and a third part (P3) extending from the second part (P2) and disposed over the side portion (INSS) of the insulating film (INS).

Such a bank (BANK) may be disposed not to cover a part of the upper surface of the first electrode (E1) in an area overlapping the concave portion (CON). That is, at least one subpixel may have an area in which the first electrode (E1) does not overlap the bank (BANK).

The organic layer (EL) including a light emitting layer may be disposed on the first electrode (E1) not overlapping the bank (BANK).

In addition, the second electrode (E2) may be disposed to cover the organic layer (EL) and the bank (BANK).

The first electrode (E1) may configured to include the reflective electrode.

The first electrode (E1) may be disposed to cover the flat portion (CONP) and the inclined portion (CONS) of the concave portion (CON) of the insulating film (INS).

Thus, some of light emitted from the organic layer (EL) may be reflected from the first electrode (E1) disposed in an area corresponding to the inclined portion (CONS) and then be extracted to outside of the panel (PNL). As a result, it is possible to enhance light extraction efficiency of the organic light emitting display panel. This description will be described in more detail with reference to FIGS. 5 and 6.

Meanwhile, a width (W1) of the first part (P1) of the bank (BANK) may be larger than a width (W2) of the second part (P2). Here, the width (W1) of the first part (P1) and the width (W2) of the second part (P2) may be a length parallel to the horizon or the surface of the substrate.

That is, an area in which the first part (P1) of the first electrode (E1) overlaps the concave portion (CON) may be larger than an area in which the second part (P2) overlaps the concave portion (CON).

Here, a ratio of the width (W2) of the second part (P2) to the width (W1) of the first part (P1) may be 1:1.5 to 1:4.

Meanwhile, the organic layer (EL) of the organic light emitting device (OLED) may be formed by a vapor deposition or coating method having straightness. For example, the organic layer (EL) may be formed by a physical vapor deposition (PVD) method such as an evaporation process.

In the organic layer (EL) formed by methods described above, a thickness of an area with a certain angle to the horizon or the surface of the substrate, may be smaller than a thickness of an area parallel to the horizon or the surface of the substrate.

For example, the organic layer (EL) disposed in an area corresponding to inclined portion (CONS) of the concave portion (CON) may be thinner than each of the organic layer (EL) disposed on the upper surface of the first electrode (E1) not covered by the bank (BANK) and the organic layer (EL) disposed on the third part of the bank (BANK).

When the organic light emitting device (OLED) is driven, an area in which the thickness of the organic layer (EL) is relatively thin, that is, the area corresponding to the inclined portion (CONS) of the concave portion (CON) may have the highest current density and the highest electric field.

Accordingly, luminescence characteristics of the organic light emitting device (OLED) in the area corresponding to the inclined portion (CONS) of the concave portion (CON) may be different from luminescence characteristics of the organic light emitting device (OLED) in the area corresponding to the flat portion (CONP) of the concave portion (CON), and thus such a structure may accelerate degradation of electronic elements.

In accordance with embodiments of the present disclosure, since the first and the second parts (P1, P2) of the bank (BANK) are disposed on the inclined portion (CONS) of the concave portion (CON), it is therefore possible to prevent the degradation of electronic elements in the area corresponding to the inclined portion (CONS) of the concave portion (CON) and to prevent the phenomenon that luminescence characteristics are different in each area.

However, embodiments of the present disclosure are not limited to such a thickness of the organic layer (EL), the thickness of the organic layer (EL) may have a thickness corresponding to its location.

The bank may be formed of a transparent inorganic insulating material or a transparent organic insulating material.

For example, in case the bank (BANK) is formed of the transparent inorganic insulating material, the bank (BANK) may be formed of at least one of SiOx, SiO2, SiON, SiNx etc., but embodiments of the present disclosure are not limited thereto.

In addition, in case the bank (BANK) is formed of the transparent organic insulating material, the bank (BANK) may be formed of photo acyl etc., but embodiments of the present disclosure are not limited thereto.

Such a bank (BANK) helps prevent the transition of a color of light resulted from absorption of light in a certain wavelength range caused by the bank, while some of light emitted from the organic layer (EL) has reflected from the first electrode (E1) disposed to correspond to the inclined portion of the concave portion (CON) and then the reflected light is extracted to outside of the panel.

That is, a material not absorbing light emitted from the organic layer (EL) is sufficient for the bank (BANK) according to embodiments of the present disclosure. For example, a material of absorbing a specific wavelength or not absorbing light corresponding to visible light range is sufficient for the bank (BANK) according to embodiments of the present disclosure In addition, as shown in FIG. 4, an auxiliary electrode (AE, or may be referred to as an auxiliary line) contacting second electrode (E2) may be further disposed in an area corresponding to the second non-light emitting area (NEA2) in the active area (A/A).

Specifically, the auxiliary electrode (AE) may be disposed on the interlayer insulating film (INF). The passivation layer (PAS), the insulating film (INS) and the bank (BNK) may have a hole that does not cover the auxiliary electrode (AE). The second electrode (E2) may contact the auxiliary electrode (AE) through the hole of the passivation layer (PAS), the insulating film (INS) and the bank (BNK), which does not cover the auxiliary electrode (AE).

For example, in case the organic light emitting display panel is a display panel having a large area, voltage drop due to the resistance of the second electrode (E2) may occur, resulting in a luminance difference between the outer edge and the center of the panel. However, in the organic light emitting display panel according to embodiments of the present disclosure, it is possible to overcome the occurring of voltage drop through the auxiliary electrode (AE) contacting the second electrode (E2). Thus, in case the organic light emitting display panel according to embodiments of the present disclosure is a panel having a large area, it is possible to prevent the occurrence of the luminance difference in the panel.

FIG. 4 shows that one auxiliary electrode (AE) is disposed in one subpixel (SP), but embodiments of the present disclosure are not limit thereto. For example, one auxiliary electrode (AE) may be disposed per on a plurality of subpixels (SP) basis.

For another example, in case the organic light emitting display panel according to embodiments of the present disclosure is not a panel having a large area, the panel may not include the auxiliary electrode (AE).

As shown in FIG. 4, at least one storage capacitor (C1, C2) may be disposed in the active area (A/A). The storage capacitor may include a first storage capacitor electrode (C1) disposed in an identical layer to the gate electrode (GATE) and a second storage capacitor electrode (C2) disposed in an identical layer to the source electrode (S) and the drain electrode (D), but the structure of the storage capacitor of the present disclosure is not limited thereto.

In addition, the display panel according to embodiments of the present disclosure may include a pad area disposed in the non-active area. A plurality of pad electrodes (P1 and P2) may be disposed in the pad area.

For example, a first pad electrode (P1) may be disposed on the plurality of insulating films (BUF, GI) disposed in the pad area. The interlayer insulating film (INF) may be disposed on the first pad electrode (P1), a part of the upper surface of which is not covered by the first pad electrode (P1). A second pad electrode (P2) that contacts the first pad electrode (P1) may be disposed over the first pad electrode (P1) and the interlayer insulating film (INF).

Although not shown in FIG. 4, various circuit films, or the like may be electrically connected to the second pad electrode (P2).

A structure the organic light emitting display panel according to embodiments of the present disclosure and corresponding paths of light will be discussed in detail referring to FIGS. 5 and 6.

Figure 5:
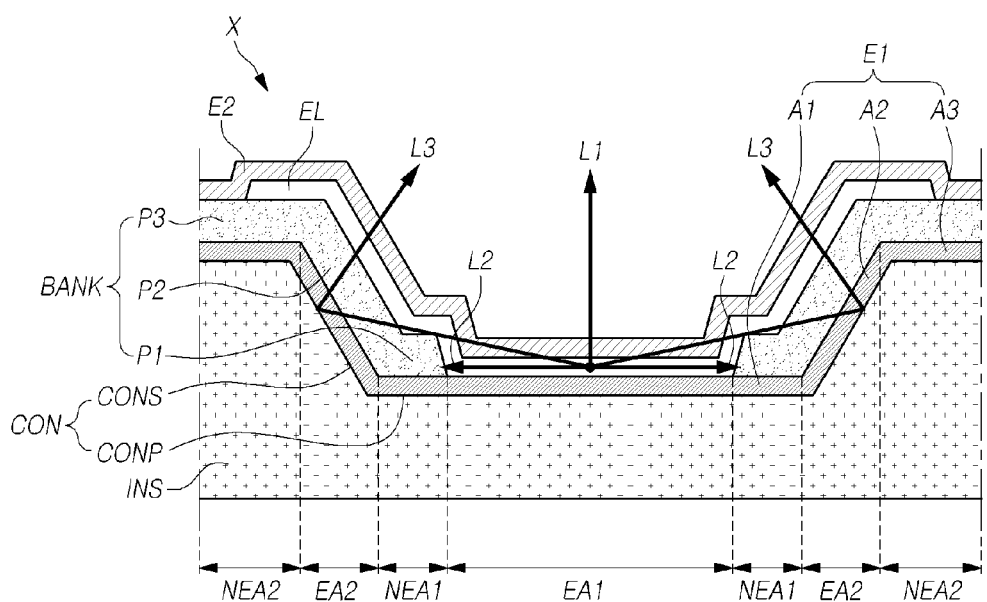
FIG. 5 is an expanded view of an X portion in FIG. 4 according to embodiments of the present disclosure.

FIG. 5 is an expanded view of an X portion in FIG. 4. FIG. 6 is an expanded view of a Y portion in FIG. 4.

Referring to FIG. 5, at least one subpixel (SP) may include at least two light emitting areas (EA1, EA2). One non-light emitting area (NEA1) may be disposed between the light emitting areas (EA1, EA2).

Specifically, the first light emitting area (EA1) may be an area corresponding to a part of the concave portion (CON) of the insulating film (INS).

In other words, the first light emitting area (EA1) may be an area not overlapping the first part (P1) of the bank (BANK) in the flat portion (CONP) of the concave portion (CON).

Meanwhile, in accordance with embodiments of the present disclosure, in at least one subpixel area, the first electrode (E1) may be disposed in the concave portion (CON) and in the side portion of the concave portion (CON).

Specifically, the first electrode (E1) may include a first area (A1) overlapping the flat portion (CONP) of the concave portion (CON), a second area (A2) extending from the first area (A1) and overlapping the inclined portion (CONS) of the concave portion (CON), and a third area (A3) extending from the second area (A2) and overlapping the side portion of the insulating film (INS).

In addition, in accordance with embodiments of the present disclosure, the first light emitting area (EA1) may be an area in which some of light emitted from the organic layer (EL) is extracted to outside of the panel through the organic layer (EL) and the second electrode (E2).

Further, the first light emitting area (EA1) may be an area in which some (L1) of light emitted from the organic layer (EL) is reflected from the first electrode (E1) after having traveled toward the first electrode (E1), and then, the reflected light is extracted to outside of the panel through the organic layer (EL) and the second electrode (E2) sequentially.

Such a first light emitting area (EA1) may correspond to an area in which the first part (P1) of the bank (BANK) does not overlap the first electrode (E1) in flat portion (CONP) of the concave portion (CON).

The first light emitting area (EA1) may be surrounded by the first non-light emitting area (NEA1).

The first non-light emitting area (NEA1) may be an area corresponding to an area in which the bank (BANK) overlaps the first electrode (E1) in the flat portion (CONP) of the concave portion (CON).

The first non-light emitting area (NEA1) may be an area formed because some (L2) of light emitted from the organic layer (EL) travels to an area corresponding to the first part (P1) of the bank (BANK), but the traveled light is not extracted to outside of the panel.

That is, the flat portion (CONP) of the concave portion (CON) may correspond to the first light emitting area (EA1) and the first non-light emitting area (NEA1).

The first non-light emitting area (NEA1) may be surrounded by the second light emitting area (EA2)).

The second light emitting area (EA2) may be an area corresponding to the second area (A2) of the first electrode (EA1). That is, the second light emitting area (EA2) may correspond to a portion in which the first electrode (EA1) is disposed to have a certain angle with respect to the surface of the substrate (SUB) by the inclined portion (CONS) of the concave portion (CON).

The second light emitting area (EA2) may include an area overlapping the inclined portion (CONS) of the concave portion (CON).

Some (L3) of light emitted from the organic layer (EL) may travel to an area corresponding to a part of the inclined portion (CONS) of the concave portion (CON).

Specifically, some (L3) of light emitted from the organic layer (EL) reaches the first electrode (E1) disposed in the inclined portion (CONS) of the concave portion (CON) through the second part (P2) of the bank (BANK). The first electrode (E1) reflects the light, and then causes the reflected light to be extracted to outside of the panel through the second part (P2) of the bank (BANK), the organic layer (EL) and the second electrode (E2).

As described above, the second light emitting area (EA2) means an area in which light (L3) emitted from the organic layer (EL) can be extracted to outside of the panel by the first electrode (E1) disposed in the inclined portion (CONS) of the concave portion (CON).

Meanwhile, the bank (BANK), the organic layer (EL) and the second electrode (E2) may be formed of a material that absorbs a certain wavelength or does not absorb light corresponding to visible light range.

Accordingly, a color coordinate of light (L3) extracted to outside of the panel through the second part (P2) of the bank (BANK), that is, light (L3) emitted from the second light emitting area (EA2), may be similar, or correspond to a color coordinate of light emitted from the first light emitting area (E1). That is, the first light emitting area E1 and the second light emitting area EA2 emit the same color of light.

It is noted that embodiments of the present disclosure are not limited thereto. For example, a color coordinate of visible light emitted from the first light emitting area (EA1) may correspond to or be different from a color coordinate of visible light emitted from the second light emitting area (EA2) adjacent to the first light emitting area (EA1).

The second light emitting area (EA2) may be surrounded by the second non-light emitting area (NEA2).

The second non-light emitting area (NEA2) may be an area corresponding to the third area (A3) of the first electrode (E1), as shown in FIG. 5.

In other words, the second non-light emitting area (NEA2) may include an area overlapping the side portion of the insulating film (INS).

Meanwhile, in typical organic light emitting display panel, there has been a problem that some of light emitted from an organic layer (EL) is not extracted to outside of a display panel (e.g., not extracted toward second electrode), and thus light extraction efficiency decreases.

In the organic light emitting display panel according to embodiments of the present disclosure, the bank (BANK) disposed in the inclined portion (CONS) of the concave portion (CON) and the inclined portion (CONS) of the concave portion (CON) may have a specific condition, in order to increase an amount of extracted light from the second light emitting area (EA2).

Figure 6:
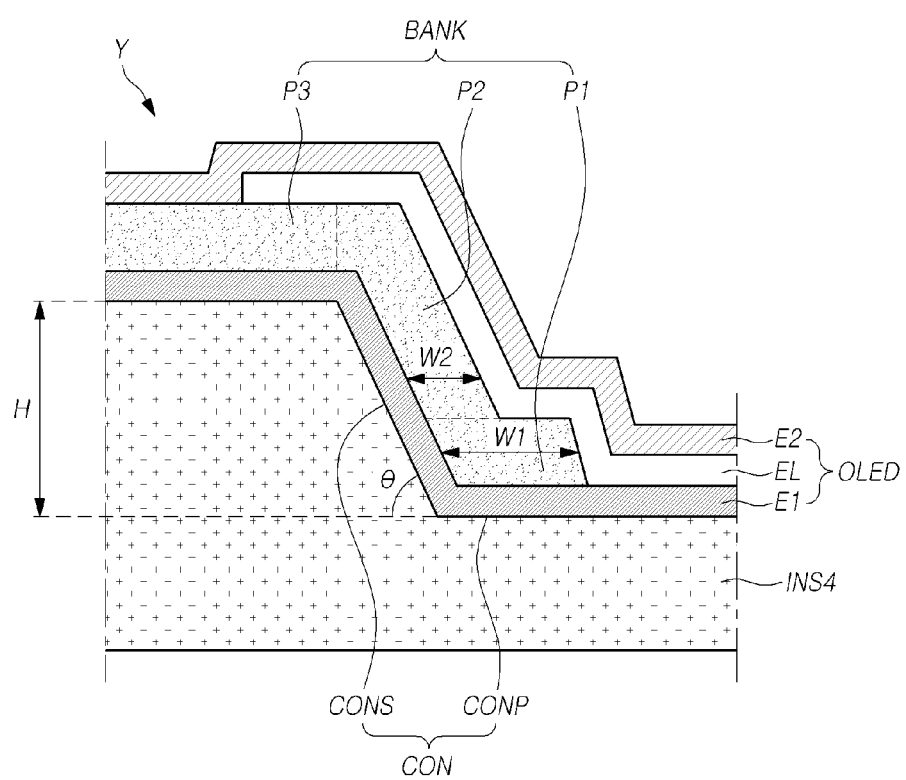
FIG. 6 is an expanded view of a Y portion in FIG. 4 according to embodiments of the present disclosure.

Referring to FIG. 6, a height (H) of the concave portion (CON) may be larger than or equal to 0.7 μm. Here, the height (H) of the concave portion (CON) means the shortest distance from a line extending parallel to the surface of the substrate (SUB) in the surface of the flat portion (CON) of the concave portion (CON) to the side portion (INSS).

Meanwhile, embodiments of the height (H) of the insulating film (INS) in which the inclined portion (CONS) of the concave portion (CON) is located are not limited to such a specific value. For example, a height by which the concave portion (CON) of the insulating film (INS) does not expose configurations disposed on a lower portion of or under the insulating film (INS) is sufficient for the height (H) of the insulating film (INS).

The height (H) of the inclined portion (CONS) may be larger than that of the bank (BANK) disposed on the side portion (INSS) of the insulating film (INS).

Thus, the larger the height (H) of the inclined portion (CONS) is, the greater an amount of reflected light from the second area (A2) of the first electrode (E1) is. Therefore, light extraction efficiency may be enhanced.

In addition, an angle (e) of the inclined portion (CONS) of the concave portion (CON) to the horizon or the surface of the substrate may be larger than or equal to 27° to less than 80°.

In case the angle is less than 27°, light emitted from the organic layer (EL) does not reach the first electrode (E1) located on the inclined portion (CONS), and therefore, the light travels toward adjacent one or more other subpixels and mixed with other colors, or is trapped inside the panel (PNL) and cannot be extracted to outside of the panel.

In case the angle is larger than 80°, disconnection may occur in the configuration of the first electrode (E1), etc. disposed on the inclined portion (CONS) of the insulating film (INS).

In addition, a distance (W2), corresponding to a width of the second part of the bank) between the first electrode (E1, a reflective electrode), such as the upper surface, and the bank (BANK), such as the upper surface thereof, may be less than or equal to 0.5 μm to 0.8 μm in an area corresponding to the inclined portion (CONS) of the concave portion (CON).

By adjusting the range of the W2 as described above, an opening area is larger by the bank (BANK), that is, the size of the first light emitting area is increased, and at the same time, it is possible to provide the organic light emitting display panel with excellent luminous efficiency.

Meanwhile, as the distance W2 is smaller, the size of the opening area of the concave portion (CON) of the bank (BANK) can be increased, and light extraction efficiency can be enhanced because a distance that light emitted from the organic layer (EL) is extracted to outside of the panel through the second part (P2) of the bank (BANK) can be decreased. Accordingly, embodiments of the value of the distance W2 are not limited to such specific values.

Meanwhile, FIGS. 4 to 6 show that the first electrode (E1) of the organic light emitting device (EL) is formed of a single layer, but embodiments of the present disclosure are not limited thereto.

Figure 7:
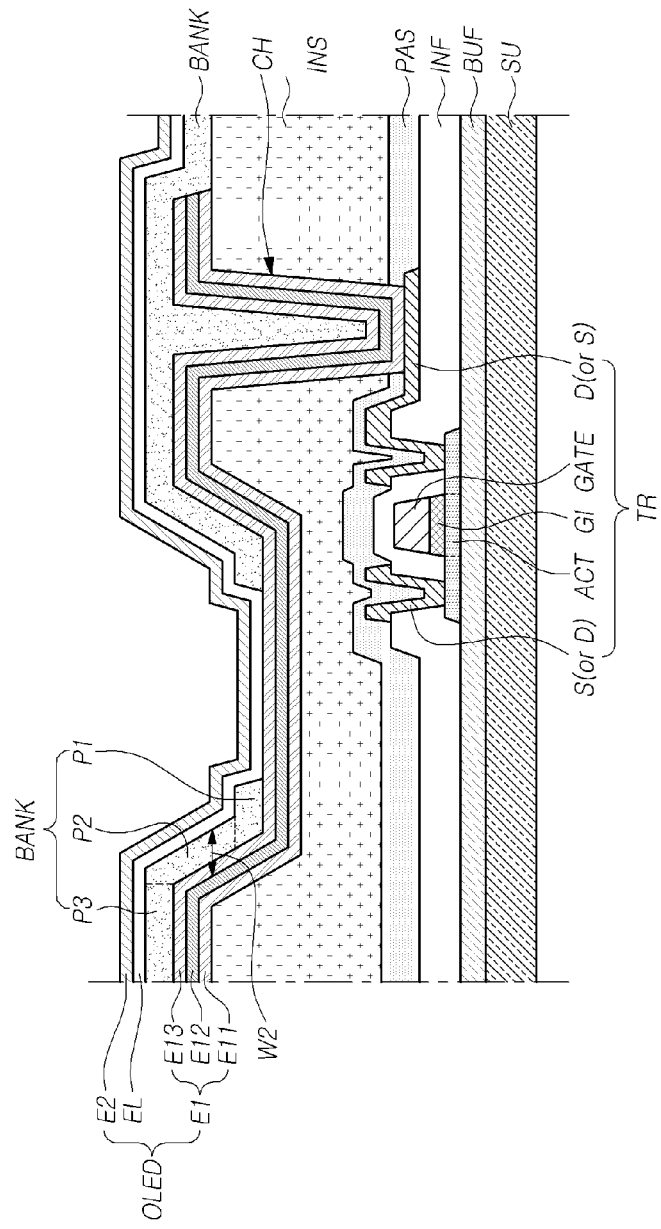
FIG. 7 is a cross-sectional view illustrating an organic light emitting display panel according to another embodiment of the present disclosure.

For example, as shown in FIG. 7, the first electrode (E1) is formed of at least 2 layers.

FIG. 7 is a cross-sectional view illustrating an organic light emitting display panel according to another embodiment of the present disclosure. In the following description, some configurations, effects etc. of the embodiments discussed above may not be repeatedly described for convenience of description.

Referring to FIG. 7, the first electrode (E1) of the organic light emitting device (OLED) may be formed of at least two layers, such as three layers, etc.

Specifically, the first electrode (E1) may include a first layer (E11), a second layer (E12) disposed on the first layer (E11), and a third layer (E13) disposed on the second layer (E12).

Here, the first layer (E11) and the third layer (E13) may be formed of a transparent conductive material. For example, the first layer (E11) and the third layer (E13) may be formed of indium gallium zinc oxide, (IGZO), indium zinc oxide (IZO), indium titanium zinc oxide (ITZO), or the like, but embodiments of the present disclosure are not limited thereto.

The second layer (E12) may be formed of a metal having high reflectance. For example, the second layer (E12) may be formed of silver (Ag), aluminum (Al), gold (Au), or an alloy thereof, but embodiments of the present disclosure are not limited thereto.

That is, as described above, the first electrode (E1) may include at least one reflective electrode layer. Through this, light traveling to one or more other subpixels of light emitted from the organic layer (EL) may be reflected by the first electrode (E1), and then extracted to outside of the panel.

Meanwhile, a value of the distance W2 as shown in FIG. 7 may be less than or equal to 0.5 µm to 0.8 µm. The distance W2 may be the shortest distance between the upper surface of the second layer (E12) of the first electrode (E1) which is the reflective electrode and the upper surface of the second part (P2) of the bank (BANK).

In addition, as shown in FIGS. 3 to 7, discussions have been conducted based on the insulating film (INS) having one concave portion (CON) in one subpixel, but embodiments of the present disclosure are not limited thereto. For example, as shown in FIG. 8, the insulating film (INS) may be configured with a plurality of insulating films in one subpixel.

Figure 8:
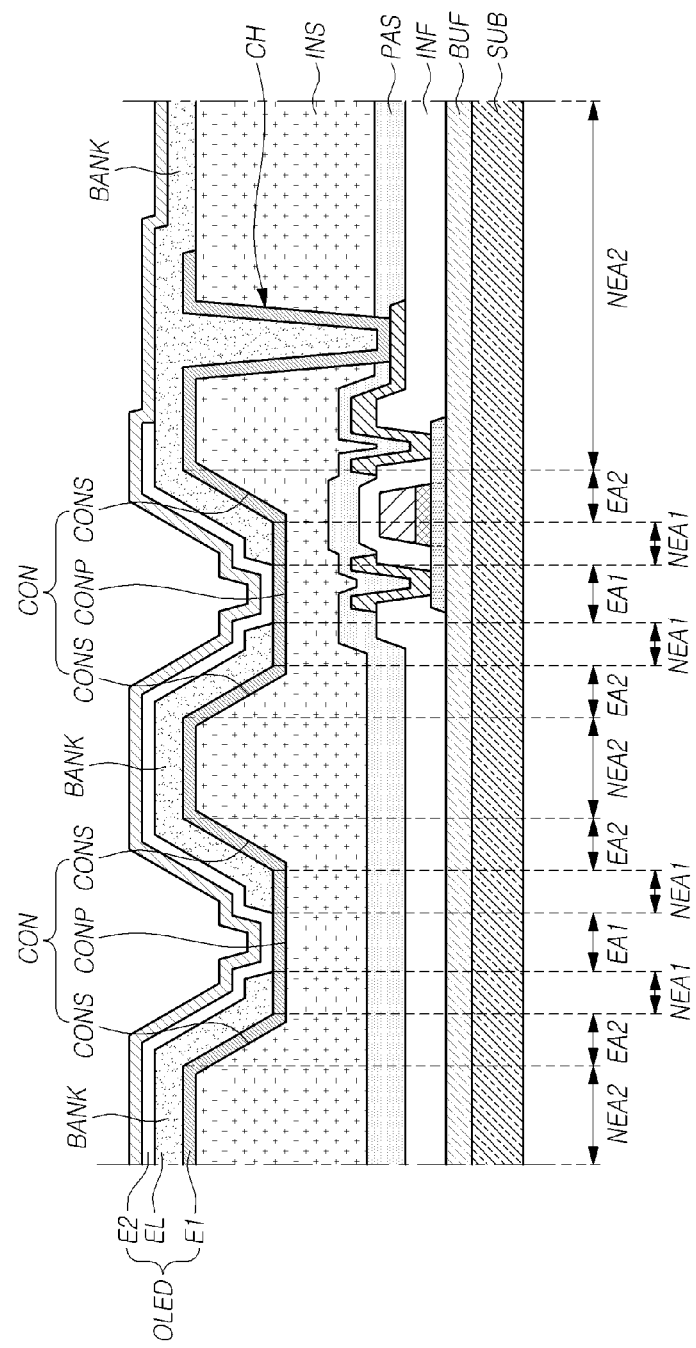
FIG. 8 is a cross-sectional view illustrating an organic light emitting display panel according to further another embodiment of the present disclosure.

FIG. 8 is a cross-sectional view illustrating an organic light emitting display panel according to further another embodiment of the present disclosure.

Referring to FIG. 8, the active area of the panel may include a plurality of subpixels, and the insulating film (INS) may be configured with a plurality of concave portions (CON) in at least one subpixel. For example, as shown in FIG. 8, the insulating film (INS) may be configured with two concave portions (CON) in one subpixel.

As shown in FIG. 8, one subpixel may include two first light emitting areas (EA1). A plurality of first non-light emitting areas (NEA1) may be disposed to surround each first light emitting area (EA1).

In addition, a plurality of second light emitting areas (EA2) may be disposed to surround each first non-light emitting area (NEA1).

In addition, a second non-light emitting areas (NEA2) may be disposed to surround a second light emitting area (EA2). The second non-light emitting area (NEA2) may disposed to surround two second light emitting areas (EA2).

The subpixel structure of the organic light emitting display device is configured as shown in FIG. 8, and therefore, it is possible to prevent light emitted from the organic layer (EL) from traveling to one or more adjacent subpixels and increase an amount of light extracted to outside of the panel. As a result, it is possible to enhance light extraction efficiency of the organic light emitting display panel.

Hereinafter, the manufacturing process of the organic light emitting display panel according to embodiments of the present disclosure will be discussed in detail.

Figure 9:
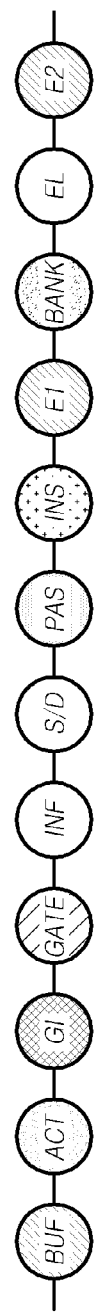
FIG. 9 is a view illustrating a process flow of the organic light emitting display panel according to embodiments of the present disclosure.
Figure 10:
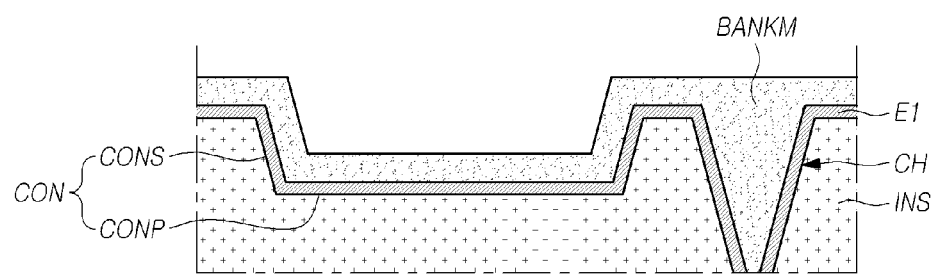
FIGS. 10 to 13 are views illustrating a process forming a bank according to embodiments of the present disclosure.

FIG. 9 is a view illustrating a process flow of the organic light emitting display device according to embodiments of the present disclosure. FIGS. 10 to 13 are views illustrating a process forming a bank according to embodiments of the present disclosure.

Referring FIGS. 9 to 13, in the organic light emitting display panel according to embodiments of the present disclosure, the buffer layer (BUF), the active layer (ACT), the gate insulating film (GI), the gate electrode (GATE), the interlayer insulating film (INF), the source electrode and the drain electrode (S, D), the passivation layer (PAS), the insulating film (INS), the first electrode (E1), the bank (BANK), the organic layer (EL) and the second electrode (E2) may be disposed on the substrate sequentially.

Meanwhile, according to embodiments of the present disclosure, one mask may be used to form the bank (BANK).

Specifically, referring to FIGS. 10 to 13, in at least one subpixel, a material of bank (BANKM) may be formed on the insulating film (INS) having at least one concave portion (CON) and at least one hole (CH).

A photoresist material may be formed on the bank material (BANKM).

Figure 11:
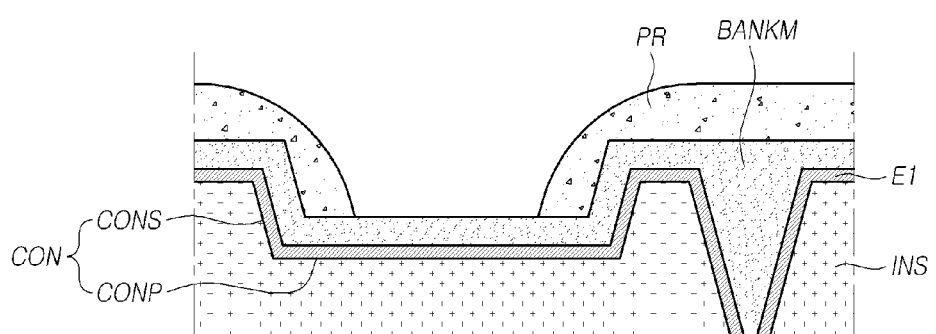
Figure 12:
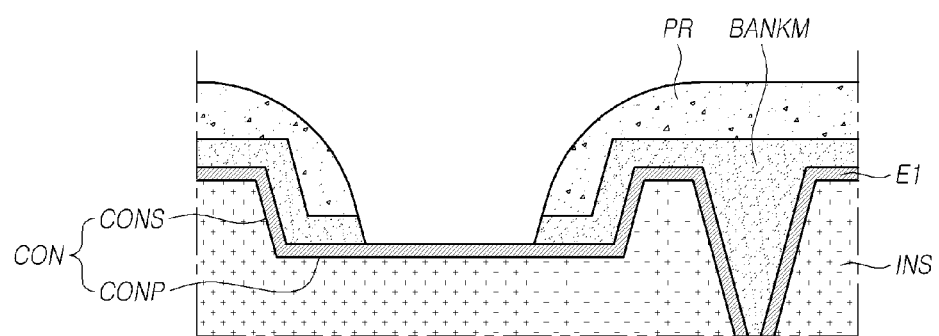
Figure 13:
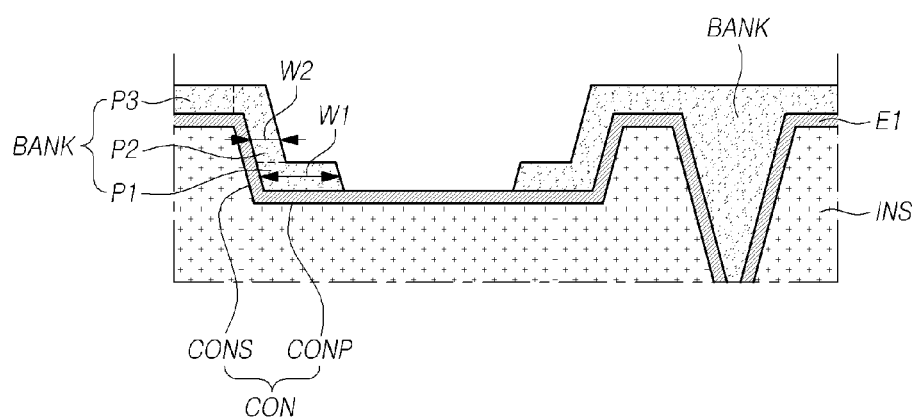

The photoresist material may be patterned through a mask process, and thus a photoresist pattern (PR) is formed as shown in FIG. 11. The photoresist pattern (PR) may be disposed to expose a part of the flat portion (CONP) of the concave portion (CON).

In addition, the bank material (BANKM) may be patterned using the photoresist pattern (PR) as a mask.

Meanwhile, a thickness of the organic layer (EL) in an area corresponding to the inclined portion (CONS) of the concave portion (CON) may be formed smaller than a thickness of the organic layer (EL) disposed in another area (e.g., an area corresponding to the flat surface of the concave portion), and therefore, it is necessary to dispose the bank (BANK) in an area corresponding to the inclined portion (CONS) of the concave portion (CON), for securing the organic light emitting device (EL).

However, in the process of patterning the bank material (BANKM), in case over-etching of the bank material (BANKM) is performed, the bank (BANK) may not be formed in a desired region.

In accordance with embodiments of the present disclosure, the bank (BANK) is formed on, as well as an area corresponding to the inclined portion (CONS) of the concave portion (CON), a part of the flat portion (CONP) of the concave portion (CON), and therefore, in case over-etching of the bank material (BANKM) is performed in the process of forming the bank (BANK), it is possible for the bank (BANK) to be formed on the inclined portion (CONS).

As described above, after the bank (BANK) has been formed, when the photoresist (PR) is removed, the bank (BANK) can be formed on the first electrode (E1) finally.

The bank (BANK) formed by processes described above may include the first part (P1) overlapping a part of the flat portion of the concave portion (CON), the second part (P2) extending from the first part (P1) and overlapping the inclined portion of the concave portion (CON), and the third part (P3) extending from the second part (P2) and disposed over the side portion (INSS) of the insulating film (INS).

Here, a width (W1) of the first part (P1) of the bank (BANK) may be different from a width (W2) of the second part (P2). Specifically, the width (W2) of the second part (P2) of the bank (BANK) may be larger than the width (W1) of the first part (P1). Here, a ratio of the width (W2) of the second part (P2) to the width (W1) of the first part (P1) may be 1:1.5 to 1:4.

Such a first part (P1) may be a portion served as a margin for preventing exposure of the inclined portion (CONS) of the concave portion (CON), even when over-etching of the bank material (BANKM) is performed in the process of forming the bank (BANK).

That is, when the bank (BANK) is formed through the first part (P1), it is possible to prevent the phenomenon that the bank is not formed due to the over-etching of the bank material in the inclined portion (CONS) of the concave portion (CON).

In accordance with embodiments of the present disclosure, in the active area, since the insulating film (INS) is configured with at least one concave portion (CON), and the first electrode (E1) of the organic light emitting device (OLED) including the reflective electrode is disposed on the concave portion (CON), therefore, it is possible to provide an organic light emitting display panel and an organic light emitting display device having a structure for enhancing luminous efficiency.

In accordance with embodiment of the present disclosure, it is possible to provide an organic light emitting display panel and an organic light emitting display device capable of preventing color mixing between adjacent subpixels.

In accordance with embodiment of the present disclosure, since the bank (BANK) having a thin thickness can be formed in an area corresponding to the inclined portion (CONS) of the concave portion (CON), therefore, it is possible to provide an organic light emitting display panel and an organic light emitting display devices having a structure for reducing a distance that light emitted from an organic layer is extracted to outside of the display.

In accordance with embodiment of the present disclosure, since the bank (BANK) is formed of a transparent organic insulating material or a transparent inorganic insulating material, therefore, it is possible to provide an organic light emitting display panel and an organic light emitting display device having a structure in which color coordinates of one or more light emitting areas which emit an identical color correspond to one another.

The features, structures, configurations, and effects described in the present disclosure are included in at least one embodiment but are not necessarily limited to a particular embodiment. A person skilled in the art can apply the features, structures, configurations, and effects illustrated in the particular embodiment embodiments to one or more other additional embodiment embodiments by combining or modifying such features, structures, configurations, and effects. It should be understood that all such combinations and modifications are included within the scope of the present disclosure Although the exemplary embodiments have been described for illustrative purposes, a person skilled in the art will appreciate that various modifications and applications are possible without departing from the essential characteristics of the present disclosure. For example, the specific components of the exemplary embodiments may be variously modified. The scope of protection of the present disclosure should be construed based on the following claims, and all technical ideas within the scope of equivalents thereof should be construed as being included within the scope of the present disclosure.

What is claimed is:

1. A method for manufacturing an organic light emitting display panel, the method comprising:
    forming an insulating film disposed on a substrate including an active area that displays an image and a non-active area that does not display the image, the insulating film including at least one concave portion in the active area, the concave portion having a flat portion, an inclined portion that extends from the flat portion and surrounds the flat portion, and a side portion that extends from the inclined portion and is farther from the substrate than the flat portion;
    forming a first electrode disposed on the side portion, the inclined portion, and the flat portion of the concave portion of the insulating film;
    forming a bank to cover a portion of the first electrode, the bank overlapping the side portion, the inclined portion, and a portion of the flat portion of the concave portion of the insulating film;
    forming an organic light emitting layer on the first electrode and the bank, the organic light emitting layer overlapping the concave portion of the insulating film; and
    forming a second electrode disposed on the organic layer and the bank, the second electrode overlapping the concave portion of the insulating film,
    wherein a thickness of the organic light emitting layer on the side portion of the concave portion is different from a thickness of the organic light emitting layer on the inclined portion of the concave portion.

2. The method according to claim 1, wherein forming the bank includes:
    forming a bank material on the first electrode;
    forming a photoresist material on the bank material;
    patterning the photoresist material to form a photoresist pattern;
    patterning the bank material by using the photoresist pattern as a mask; and
    removing the photoresist pattern to form the bank.

3. The method according to claim 2, wherein the photoresist pattern overlaps the side portion, the inclined portion, and a portion of the flat portion of the concave portion.

4. The method according to claim 2, wherein the bank material is patterned to expose a portion of the first electrode on the flat portion of the concave portion.

5. The method according to claim 1, wherein the bank includes a first part, a second part, and a third part, wherein the first part is disposed on the first electrode and overlaps a portion of the flat portion of the concave portion, the second part extends from the first part and overlaps the inclined portion of the concave portion, and the third part extends from the second part and overlaps the side portion, wherein a width of the first part of the bank is wider than a width of the second part of the bank.

6. The method according to claim 1, wherein one side of the bank has two steps in a region where the concave portion is disposed.

7. The method according to claim 1, wherein the first electrode includes a first area, a second area, and a third area, wherein the first area overlaps the flat portion of the concave portion, the second area extends from the first area and overlaps the inclined portion of the concave portion, and the third area extends from the second area and overlaps the side portion.

8. The method according to claim 7, wherein the bank does not cover a part of the first area of the first electrode.

9. The method according to claim 8, wherein the part of the first area of the first electrode that is not covered by the bank is a first light emitting area that is disposed in the flat portion of the concave portion.

10. The method according to claim 9, wherein the second area of the first electrode that overlaps the inclined portion of the concave portion further comprises a second light emitting area that surrounds the first light emitting area,
    wherein the second light emitting area corresponds to the second area of the first electrode.

11. The method according to claim 10, wherein a portion of the first area of the first electrode that is overlapped by the bank is a first non-light emitting area that is disposed between the first light emitting area and the second light emitting area.

12. The method according to claim 10, wherein the third area of the first electrode is a second non-light emitting area that surrounds the second light emitting area.

13. The method according to claim 7, wherein the first electrode is reflective.

14. The method according to claim 13, wherein a distance between the second area of the first electrode and the bank is less than or equal to 0.5 μm to 0.8 μm.

15. The method according to claim 5, wherein a ratio of the width of the second part of the bank to the width of the first part of the bank is in a range from 1:1.5 to 1:4.

16. The method according to claim 5, wherein the bank comprises a transparent inorganic insulating material or a transparent organic insulating material.

17. The method according to claim 1, wherein the organic light emitting layer is disposed over all of the insulating film or over a portion of the insulating film.

18. A method for manufacturing an organic light emitting display panel, the method comprising:
   forming a transistor in an active area of a substrate including the active area that displays an image and a non-active area that does not display the image;
   forming an insulating film disposed over the transistor in the active area of the substrate, the insulating film including a concavity; and
   forming a sub-pixel electrically connected to the transistor, the sub-pixel including a plurality of concentric light emitting areas and a non-light emitting area in the concavity of the insulating film, the non-light emitting area disposed between the plurality of concentric light emitting areas.

19. The method according to claim 18, wherein the concavity of the insulating film comprises a flat portion, an inclined portion that extends from the flat portion and surrounds the flat portion, and a side portion that extends from the inclined portion and is farther from the substrate than the flat portion and wherein the sub-pixel comprises:
   a first electrode disposed on the side portion, the inclined portion, and the flat portion of the concavity;
   a bank including a first part, a second part, and a third part, wherein the first part is disposed on the first electrode and overlaps a portion of the flat portion of the concavity, the second part extends from the first part and overlap the inclined portion of the concavity, and the third part extending from the second part and overlapping the side portion, wherein a width of the first part of the bank is wider than a width of the second part of the bank;
   an organic light emitting layer on the first electrode and the bank, the organic light emitting layer overlapping the concavity; and
   a second electrode disposed on the organic layer and the bank, the second electrode overlapping the concavity.

\* \* \* \* \*